(12) United States Patent
Ohyama et al.

(10) Patent No.: US 8,545,111 B2
(45) Date of Patent: Oct. 1, 2013

(54) OPTICAL MODULE

(75) Inventors: Takaharu Ohyama, Atsugi (JP);
Yoshiyuki Doi, Atsugi (JP); Ikuo Ogawa, Atsugi (JP); Akimasa Kaneko, Atsugi (JP); Yasuaki Tamura, Yokohama (JP); Yuichi Suzuki, Yokohama (JP)

(73) Assignees: Nippon Telegraph and Telephone Corporation, Tokyo (JP); NTT Electronics Corporation, Yokohama-shi, Kanagawa (JP)

( * ) Notice: Subject to any disclaimer, the term of this patent is extended or adjusted under 35 U.S.C. 154(b) by 606 days.

(21) Appl. No.: 12/666,583

(22) PCT Filed: Jun. 30, 2008

(86) PCT No.: PCT/JP2008/061849
§ 371 (c)(1),
(2), (4) Date: Dec. 23, 2009

(87) PCT Pub. No.: WO2009/001958
PCT Pub. Date: Dec. 31, 2008

(65) Prior Publication Data
US 2010/0322569 A1   Dec. 23, 2010

(30) Foreign Application Priority Data
Jun. 28, 2007   (JP) .................. 2007-171164

(51) Int. Cl.
G02B 6/36   (2006.01)
(52) U.S. Cl.
USPC .......................................... 385/92

(58) Field of Classification Search
USPC .......................................... 385/92
See application file for complete search history.

(56) References Cited

U.S. PATENT DOCUMENTS 5,444,804 A * 8/1995 Yui et al. .................. 385/49
5,673,345 A * 9/1997 Saito et al. ................ 385/49

(Continued)

FOREIGN PATENT DOCUMENTS

JP   61-028240   2/1986
JP   63-205617   8/1988

(Continued)

OTHER PUBLICATIONS

T. Oyama et al., *40-ch Optical Power Channel Monitor Module Using AWG and CSP-PD Array*, The Institute of Electronics, Information and Communication Engineers, Electronics Society Convention Lecture Paper Collection 1, C-3-78, 2006, p. 200 (English translation attached).

(Continued)

*Primary Examiner* — Uyen Chan N Le
*Assistant Examiner* — Hoang Tran
(74) *Attorney, Agent, or Firm* — Workman Nydegger

(57) ABSTRACT

An optical module has a structure for reducing the stress applied to a package. The optical module is structured so that an end face of a waveguide (37) of a planar lightwave circuit (30) is joined to a plurality of packages (40) storing therein optical elements so that the waveguide is optically coupled to the optical elements. The optical module includes a housing (3) storing therein a planar lightwave circuit and a plurality of packages in which an upper face of a protrusion (270) formed in the bottom section is fixed to the planar lightwave circuit (30). Each of the plurality of packages (40) is electrically connected to an electric part (22) provided in the housing (3) via flexible printed circuits (271a, 271b).

22 Claims, 18 Drawing Sheets

(56) References Cited

U.S. PATENT DOCUMENTS 6,480,639 B2 * 11/2002 Hashimoto et al. ............ 385/14
6,485,197 B1 * 11/2002 Kato ............................... 385/92
6,950,314 B2 * 9/2005 Reznik et al. ................. 361/764

FOREIGN PATENT DOCUMENTS

| JP | 02-073207 | 3/1990 |
|----|-----------|--------|
| JP | 04-001604 | 1/1992 |
| JP | 06-067041 | 3/1994 |
| JP | 11-345932 | 12/1999 |
| JP | 2003-283075 | 10/2003 |
| JP | 2004-206015 | 7/2004 |
| JP | 2005-084126 | 3/2005 |
| JP | 2006-128514 | 5/2006 |
| JP | 2006-243391 | 9/2006 |
| WO | 2006/035633 A1 | 4/2006 |
| WO | 2007/037364 A1 | 5/2007 |

OTHER PUBLICATIONS

English translation of International Preliminary Report on Patentability and Written Opinion of the International Searching Authority from PCT/JP2008/061849 dated Feb. 4, 2010 (7 pages).

* cited by examiner

OPTICAL MODULE

TECHNICAL FIELD

The present invention relates to an optical module. In particular, the present invention relates to the structure of the optical module that is stable against temperature fluctuation.

BACKGROUND ART

In recent years, with the diffusion of optical fiber transmission, various techniques have been required to realize optical signal processing functions. Furthermore, a technique has been also required to integrate a great number of optical elements with a high density. Among the techniques as described above, a planar lightwave circuit (hereinafter referred to as PLC) is known. The PLC is generally an optical circuit that is structured so that an optical waveguide composed of a core and a clad for propagating an optical signal and optical function elements are integrated on a silicon substrate or a quartz substrate. The PLC is superior in productivity and reliability and is also superior in integration and high function. Thus, the development for an optical module which integrates, for example, PLC, light-emitting elements such as LD, and light-receiving elements such as PD in a high quantity at a high density has been actively carried out.

FIG. 1 illustrates the configuration of a conventional optical module. An optical module 1 is structured so that a housing 3 includes therein a printed circuit board 20 having thereon a PLC 30, PD packages 40, and connectors 22. As an example, the PLC 30 has, as an optical function element, an arrayed waveguide grating-type optical multiplexer/demultiplexer (hereinafter referred to as AWG) (see Non-patent Publication 1 for example). The AWG is composed of: an input slab waveguide 34 coupled to an input waveguide 33 connected to optical fiber 2, an output slab waveguide 36 coupled to an output waveguide 37, and an array waveguide 35 connecting the input slab waveguide 34 to the output slab waveguide 36.

An end face of the output waveguide 37 of the AWG (i.e., an end face of the PLC 30) is joined to the PD packages 40. The optical module 1 is an optical power monitor in which a wavelength division multiplexing signal input from the optical fiber 2 is branched by the AWG to optical signals having individual wavelengths and the signals are received by the individual light-receiving faces of the PD stored in the PD packages 40.

FIG. 2 illustrates the configuration of a conventional PD package. In the PD package 40, a PD array 43 having a plurality of light-receiving faces 44 (i.e., a plurality of optical elements) are stored in a ceramic housing 41. The ceramic housing 41 is connected to a glass cover 42 by soldering, so that the PD array 43 is sealed in an air-tight manner. The PD array 43 is connected, via an electric wiring 45 electrically connected thereto, to other elements exterior to the housing 41. The PD package 40 is called a chip scale package-type PD array. The PD package 40 is much smaller when compared to a PD array module in which a plurality of PDs of a CAN package are arranged. Thus, the PD package 40 attracts attention as a technique by which many PDs can be integrated with a low cost (see Patent Publication 1 for example).

FIG. 3 illustrates a method of fixing a PLC and PD packages in a conventional optical module. FIG. 3 is a cross-sectional view taken along III-III in FIG. 1. The PLC 30 is structured so that a substrate 32 has thereon an optical waveguide layer 31. The optical waveguide layer 31 has AWG. The output waveguides 37a and 37b formed in AWG have vertically-polished end faces that are joined to the glass covers 42 of the PD packages 40 by UV adhesive agent. The respective light-receiving faces of the PD array 43 are optically connected to the respective output waveguides 37.

The electric wiring 45, which is electrically connected to the PD array 43, is drawn to the exterior of the housing 41 and is attached with a lead pin 46. The electric wiring 45 or the lead pin 46 is soldered to an electric wiring 21 formed on the printed circuit board 20 and is electrically connected to the connectors 22a and 22b. In this way, the PD packages 40 are fixed to the surface of the printed circuit board 20 and have a function to fix the PLC 30 on the printed circuit board 20.

The conventional optical module 1 had a disadvantage in that a temperature fluctuation tends to cause the fluctuation of a characteristic such as a light-receiving sensitivity characteristic. Generally, the PLC 30 formed on the substrate 32, the printed circuit board 20, and the housing 3 have different thermal expansion coefficients. Thus, when the optical module 1 has a temperature fluctuation, each size of the substrate 32, the printed circuit board 20 and the housing 3 varies respectively. Due to variation of sizes, a high stress is applied to the PD packages 40 having a function to fix the PLC 30 on the printed circuit board 20 or the housing 3. This stress causes positional displacement at the face at which the PLC 30 is connected to the PD packages 40. This positional displacement causes a fluctuation of the coupling efficiency between the light-receiving face 44 of the PD array 43 and the optical output end of the output waveguide 37 of the PLC 30.

It is an objective of the present invention to provide an optical module for which the optical module is structured to mitigate the stress applied to the package to thereby reduce thermal fluctuations in characteristics.

Patent Publication 1: Japanese Laid-Open Publication No. 2006-128514

Non-patent Publication 1: T. Oyama et. al, "40-ch optical power channel monitor module using AWG and CSP-PD array," 2006, The Institute of Electronics, Information and Communication Engineers, Electronics Society Convention Lecture Paper Collection 1, C-3-78, p. 200

DISCLOSURE OF THE INVENTION

In order to achieve the objective as described above, the present invention is characterized in that, in an optical module in which an end face of a waveguide of a planar lightwave circuit is joined to a plurality of packages storing therein optical elements so that the waveguide is optically coupled to the optical elements, according to the first embodiment, the optical module comprises: a housing storing therein the planar lightwave circuit and the plurality of packages, wherein the planar lightwave circuit is fixed to an upper face of a protrusion formed in a bottom section, and wherein each of the plurality of packages is electrically connected to electric parts provided in the housing via a flexible printed circuit.

According to the first embodiment, the planar lightwave circuit is fixed to the upper face of the protrusion formed in the bottom section of the housing. Each of the plurality of packages is electrically connected to the electric part provided in the housing via a flexible printed circuit. This prevents the positional displacement between the package and the PLC.

In the first embodiment, the protrusion of the housing and the planar lightwave circuit are fixed by elastic adhesive agent. Preferably, the protrusion of the housing and the planar lightwave circuit are fixed so that only one of opposing short sides of the planar lightwave circuit is fixed. Furthermore, the protrusion of the housing and the planar lightwave circuit are fixed so that one of the opposing short sides of the planar lightwave circuit is fixed in the vicinity of the package. In addition, flowable filler is preferably filled in an interface between the protrusion of the housing and the planar lightwave circuit.

The second embodiment is characterized in that an optical module includes a printed circuit board mounted in a housing storing therein the planar lightwave circuit and the plurality of packages, the printed circuit board fixing the plurality of packages on that surface, wherein the printed circuit board has a space of a fixed width along a straight line connecting mounting sections at which the plurality of packages are mounted.

According to the second embodiment, the printed circuit board has a space between the plurality of packages, such as a notch, a hollow. This can consequently suppress thermal stress caused by a difference in thermal expansion coefficient between the printed circuit board and the planar lightwave circuit. In this manner, the optical module can have a structure for reducing the stress applied to the package, thus reducing thermal fluctuations in characteristics.

In the second embodiment, the printed circuit board also can be divided to a plurality of parts each of which fixes one of the plurality of packages on that surface and the printed circuit board also can have a space of a fixed width along a straight line connecting the mounting sections. By mounting the package in the respective independent printed circuit boards, a space is provided between the plurality of packages. This can consequently reduce thermal stress due to the difference in thermal expansion coefficient between the printed circuit board and the PLC substrate.

Alternatively, at least one of the plurality of divided parts of the printed circuit board also can be slid along the straight line connecting the mounting sections. The packages are mounted in the respective independent printed circuit boards and at least one printed circuit board can be slid in one direction. Even when a temperature fluctuation causes the PLC substrate to expand or contract to have a size fluctuation, the printed circuit board moves in accordance with the motion thereof, thus avoiding the positional displacement between the package and the PLC.

The third embodiment is characterized in that an optical module includes a printed circuit board mounted in a housing storing therein the planar lightwave circuit and the plurality of packages, wherein each of the plurality of packages is electrically connected to the printed circuit board via a flexible printed circuit.

According to the third embodiment, each of a plurality of package electrically connected to the printed circuit board via the flexible printed circuit can reduce the stress applied between the packages.

In the third embodiment, the flexible printed circuit can be connected to the package by an anisotropically-conductive film (ACF).

The fourth embodiment is characterized in that an optical module includes a printed circuit board mounted in a housing storing therein the planar lightwave circuit and the plurality of packages, the printed circuit board fixing the plurality of packages on that surface, wherein the printed circuit board is a flexible printed circuit.

According to the fourth embodiment, by using the flexible printed circuit as a printed circuit board, the printed circuit board can have increased flexibility and, even when a temperature fluctuation causes the PLC substrate to expand or contract to have a size fluctuation, the printed circuit board can move in accordance with the motion thereof expand or contract, thus reducing the stress applied to the package.

The fifth embodiment is characterized in that an optical module includes a printed circuit board mounted in a housing storing therein the planar lightwave circuit and the plurality of packages, the printed circuit board fixing the plurality of packages on that surface, wherein the printed circuit board is made of any of aluminum nitride and silicon carbide.

According to the fifth embodiment, the printed circuit board also can be made of aluminum nitride or silicon carbide having a thermal expansion coefficient close to that of silicon. Thus, even when a temperature fluctuation causes the PLC substrate to expand or contract to have a size fluctuation, the printed circuit board can move in accordance with the motion thereof expand or contract, thus reducing the stress applied to the package.

BEST MODE FOR CARRYING OUT THE INVENTION

Hereinafter, embodiments of the present invention will be described with reference to the drawings. In the following description, members having the same functions are denoted with the same references.

Embodiment 1

Figure 4:
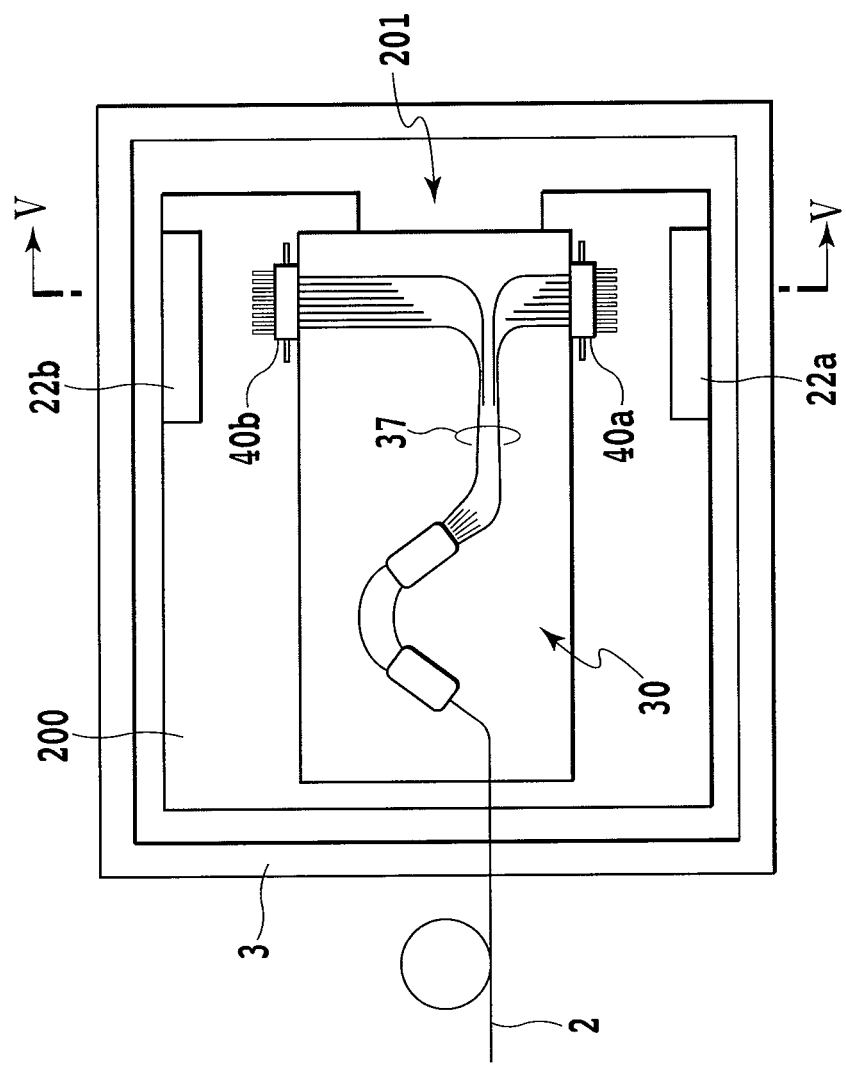
FIG. 4 is a top view illustrating the configuration of an optical module according to Embodiment 1 of the present invention.

FIG. 4 illustrates a configuration of an optical module according to Embodiment 1 of the present invention. The optical module 1 is a 16-channel optical power monitor that has the PLC 30 having an AWG having 16 output waveguides 37. An end face of the PLC 30 is joined to the two PD packages 40a and 40b storing therein the 8-channel PD array 43. The optical module 1 is structured so that the printed circuit board 200 including the PLC 30, the PD packages 40a and 40b, and the connectors 22a and 22b is provided in the housing 3. A wavelength division multiplexing signal of 16 waves input from the optical fiber 2 is branched by the AWG to optical signals having individual wavelengths and the signals are received by the light-receiving faces of the individual PDs stored in the PD packages 40a and 40b.

Figure 5:
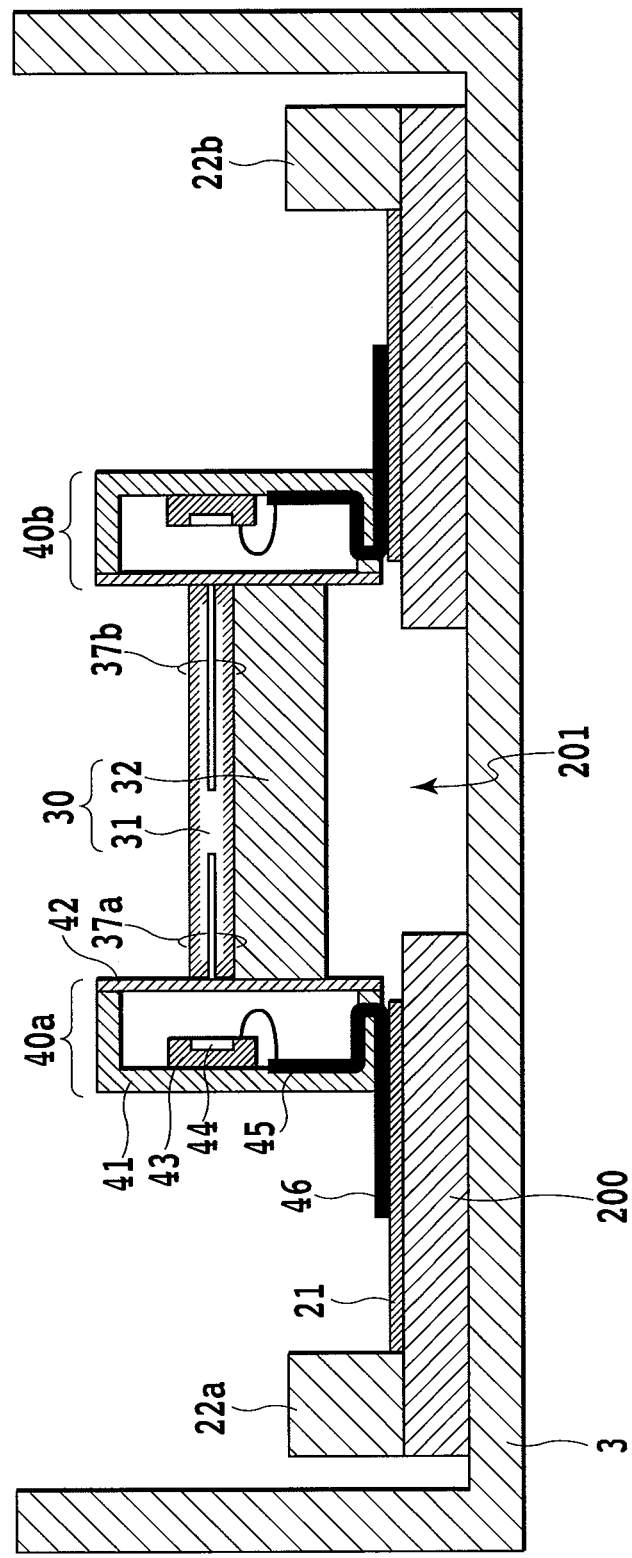
FIG. 5 is a cross-sectional view illustrating a method of fixing the PLC and the PD packages according to Embodiment 1.

FIG. 5 illustrates a method of fixing the PLC and the PD packages according to Embodiment 1. FIG. 5 is a cross-sectional view taken along V-V in FIG. 4. The output waveguide 37 of the AWG has a vertically-polished end face that is joined to the glass covers 42 of the PD packages 40 by UV adhesive agent. The respective light-receiving faces of the PD array 43 are optically coupled to the respective output waveguides 37.

The electric wiring 45 or the lead pin 46 of the PD packages 40 is soldered to the electric wiring 21 formed on the printed circuit board 200 and is electrically connected to the connectors 22a and 22b. The PD packages 40 are fixed to the surface of the printed circuit board 200 and have a function to fix the PLC 30 on the printed circuit board 200. The printed circuit board 200 is fixed on a bottom face in the housing 3 by elastic adhesive agent. The stress caused by a difference in thermal expansion coefficient between the printed circuit board 200 and the housing 3 is absorbed by the deformation of the elastic adhesive agent. This can consequently suppress the positional displacement at the face at which the PLC 30 is connected to the PD packages 40.

Figure 6:
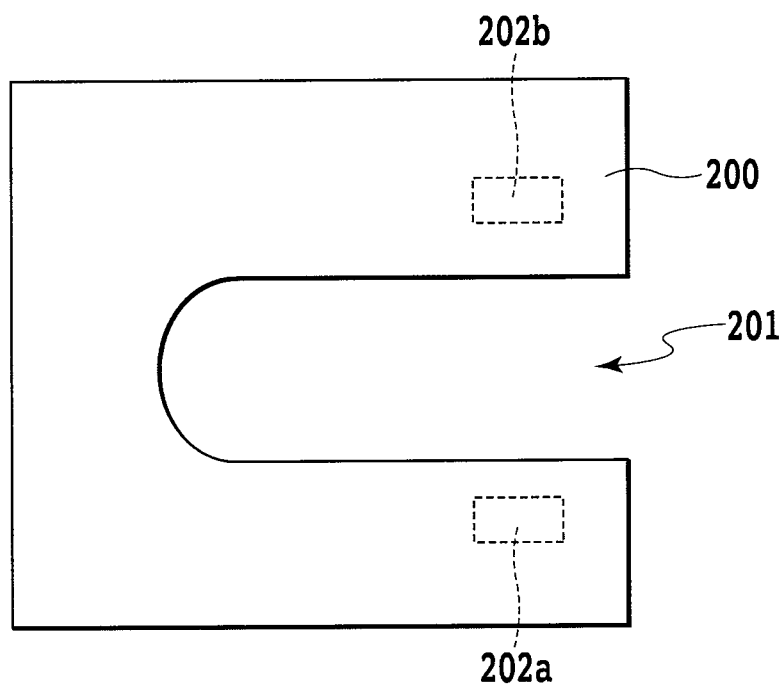
FIG. 6 is a top view illustrating the shape of a printed circuit board according to Embodiment 1.

FIG. 6 illustrates the shape of the printed circuit board according to Embodiment 1. Mounting sections 202a and 202b for mounting the PD packages 40 are provided at two positions on the printed circuit board 200, and a space 201 is provided between the mounting sections 202a and 202b. In this way, a space having a fixed width in which the printed circuit board does not exist is provided along a line between the PD packages 40a and 40b (i.e., a straight line V-V connecting the mounting sections 202a and 202b). This can consequently prevent a situation where thermal stress caused by a difference in thermal expansion coefficient between the printed circuit board 200 and the substrate 32 is directly applied to the PD packages 40. This can consequently avoid the positional displacement between the PD packages and the PLC due to thermal stress, thus realizing an optical module having a small thermal fluctuation in characteristics.

Embodiment 2

Figure 7:
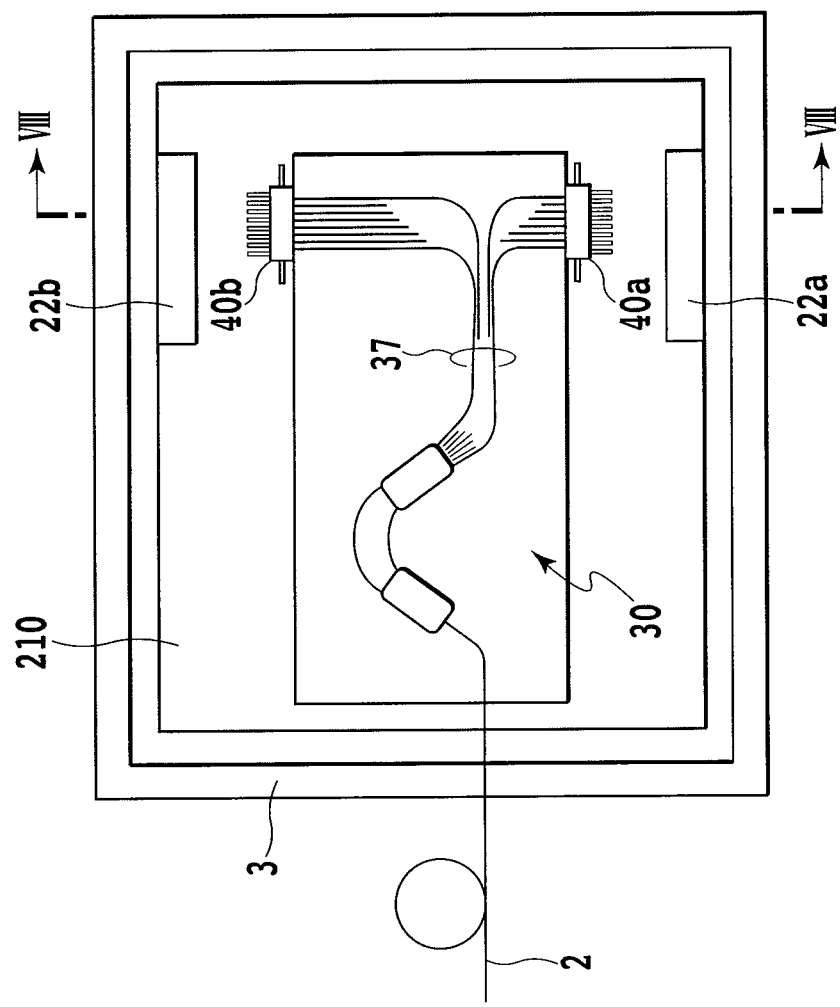
FIG. 7 is a top view illustrating the configuration of a optical module according to Embodiment 2 of the present invention.

FIG. 7 illustrates a configuration illustrating an optical module according to Embodiment 2 of the present invention. The optical module 1 is a 16-channel optical power monitor that has the PLC 30 having an AWG having 16 output waveguides 37. An end face of the PLC 30 is joined to the two PD packages 40a and 40b storing therein the 8-channel PD array 43. The optical module 1 is structured so that the printed circuit board 200 including the PLC 30, the PD packages 40a and 40b, and the connectors 22a and 22b is provided in the housing 3. A wavelength division multiplexing signal of 16 waves input from the optical fiber 2 is branched by the AWG to optical signals having individual wavelengths and the signals are received by the light-receiving faces of the individual PDs stored in the PD packages 40a and 40b.

Figure 1:
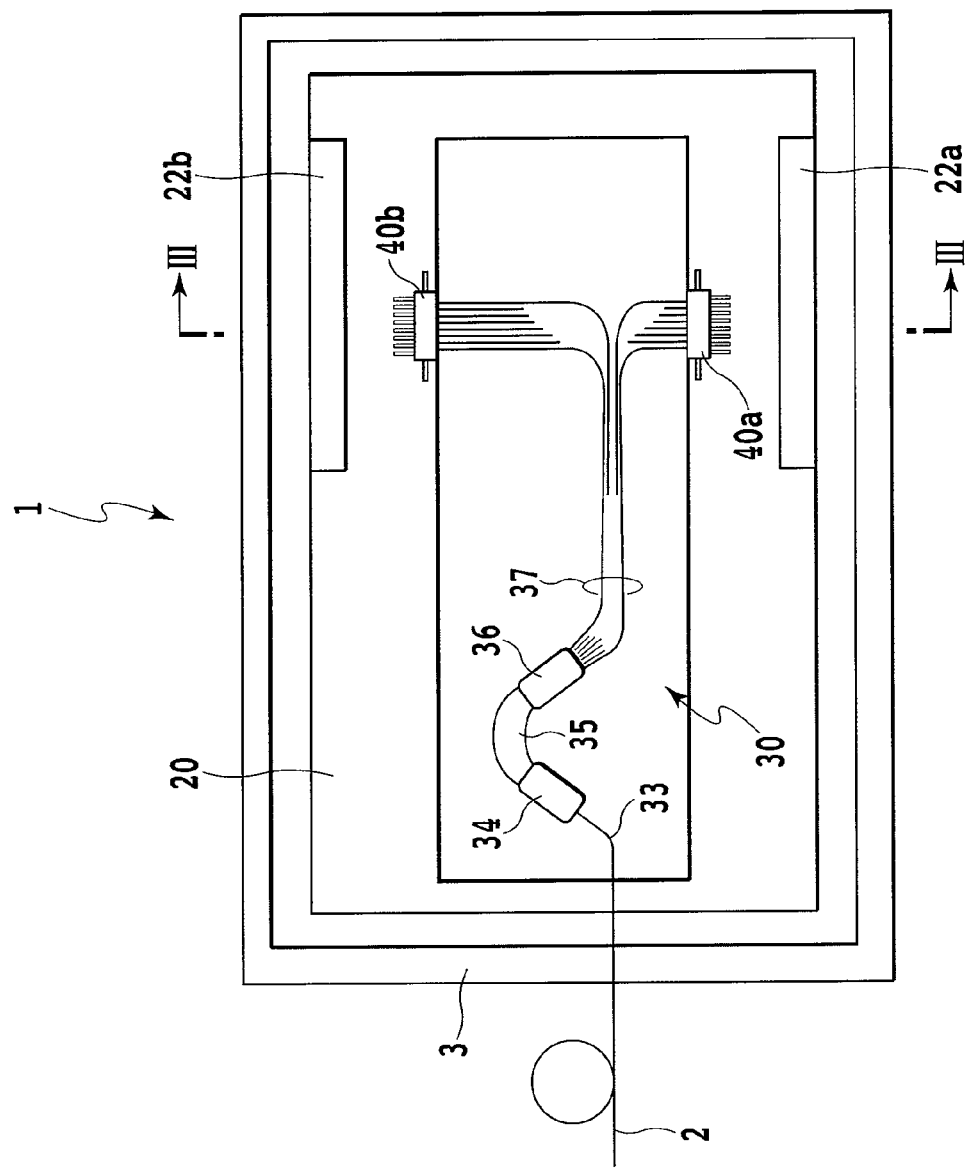
FIG. 1 is a top view illustrating the configuration of a conventional optical module.
Figure 2:
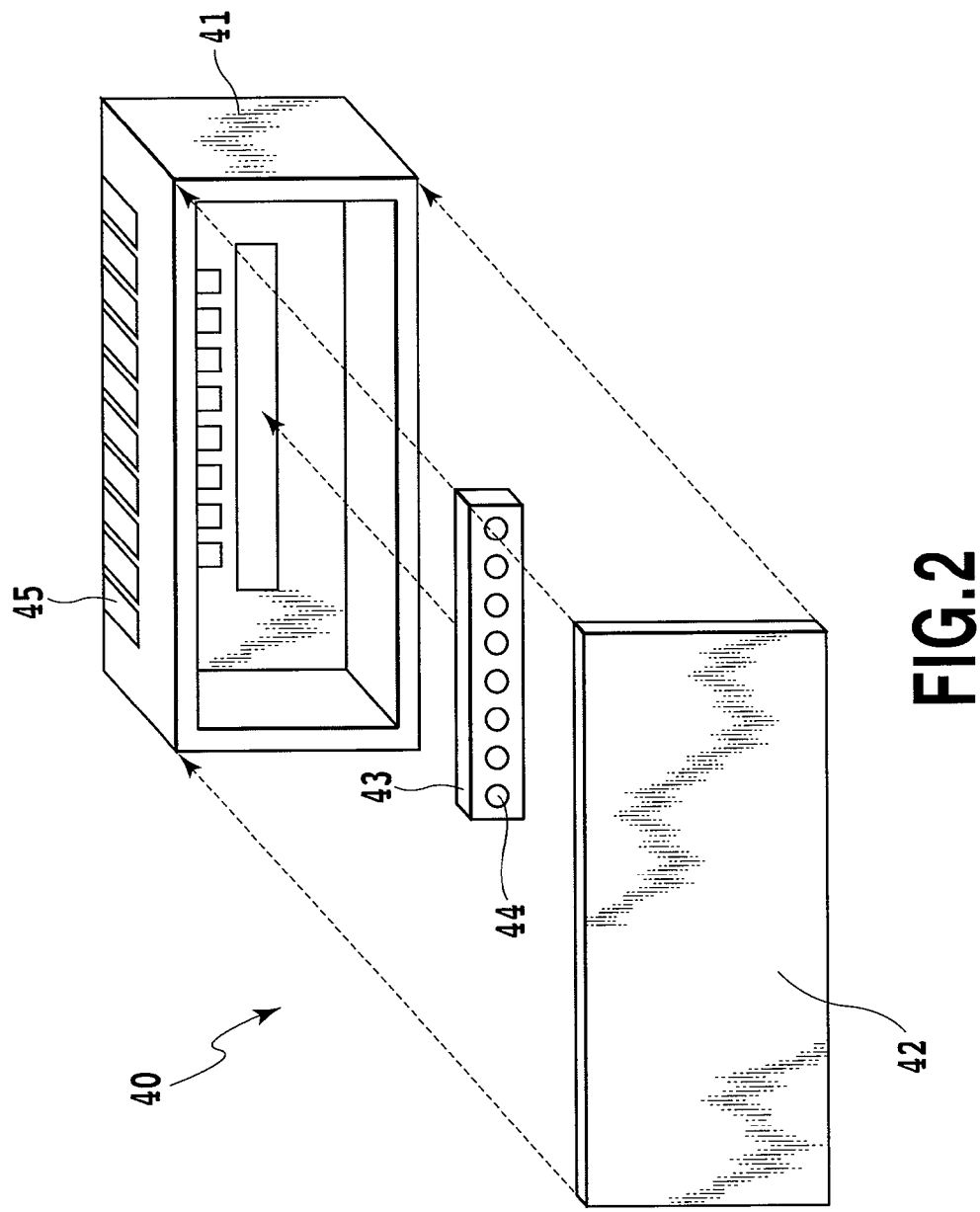
FIG. 2 is a perspective view illustrating the configuration of a conventional PD package.
Figure 3:
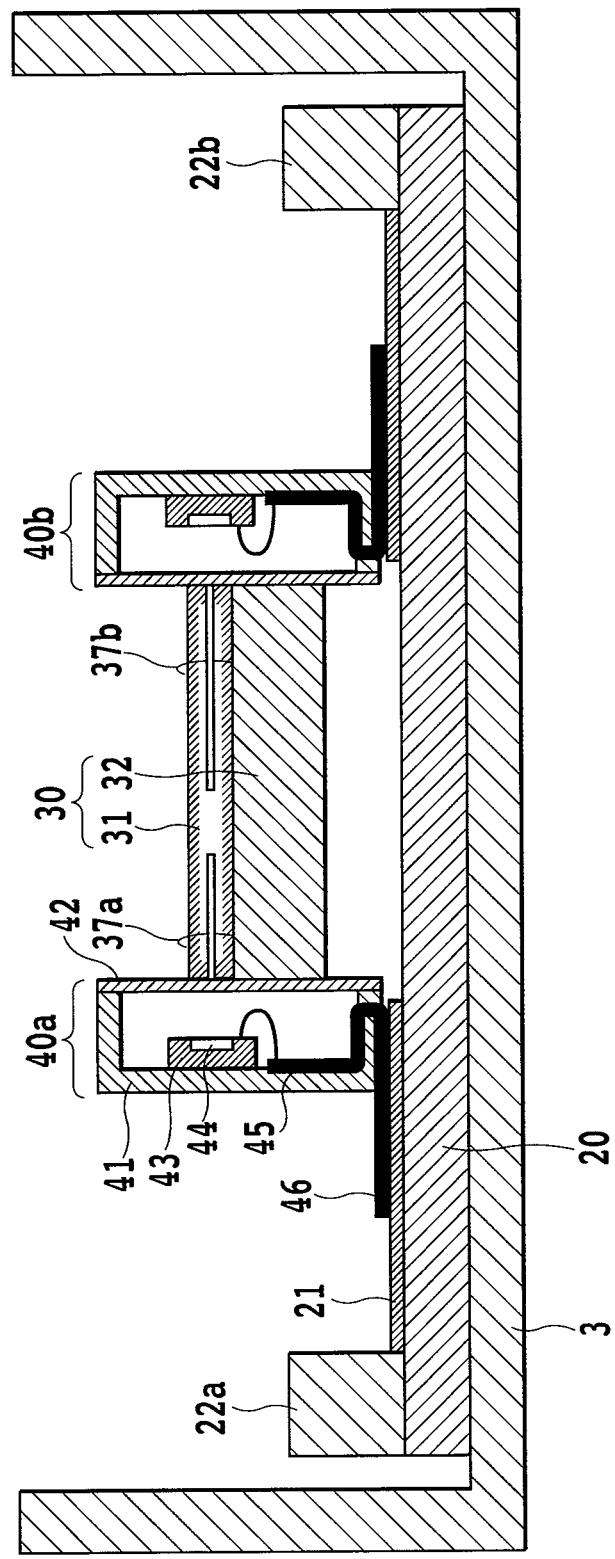
FIG. 3 is a cross-sectional view illustrating a method of fixing a PLC and PD packages in a conventional optical module.

A cross-sectional view taken along VIII-VIII of FIG. 7 is identical as that of FIG. 3. Embodiment 2 is different from the conventional optical module in the printed circuit board. The printed circuit board 210 of Embodiment 2 is made of aluminum nitride. The printed circuit board made of aluminum nitride having a thermal expansion coefficient close to that of silicon reduces, even when a temperature fluctuation is caused, a size difference between the printed circuit board 210 and the substrate 32 due to thermal expansion. This can reduce, even when a temperature fluctuation is caused, the stress applied to the PD packages 40 to thereby avoid the positional displacement between the PD packages and the PLC. Thus, an optical module having a small thermal fluctuation in characteristics can be realized. The printed circuit board also may be made of silicon carbide.

Embodiment 3

Figure 8:
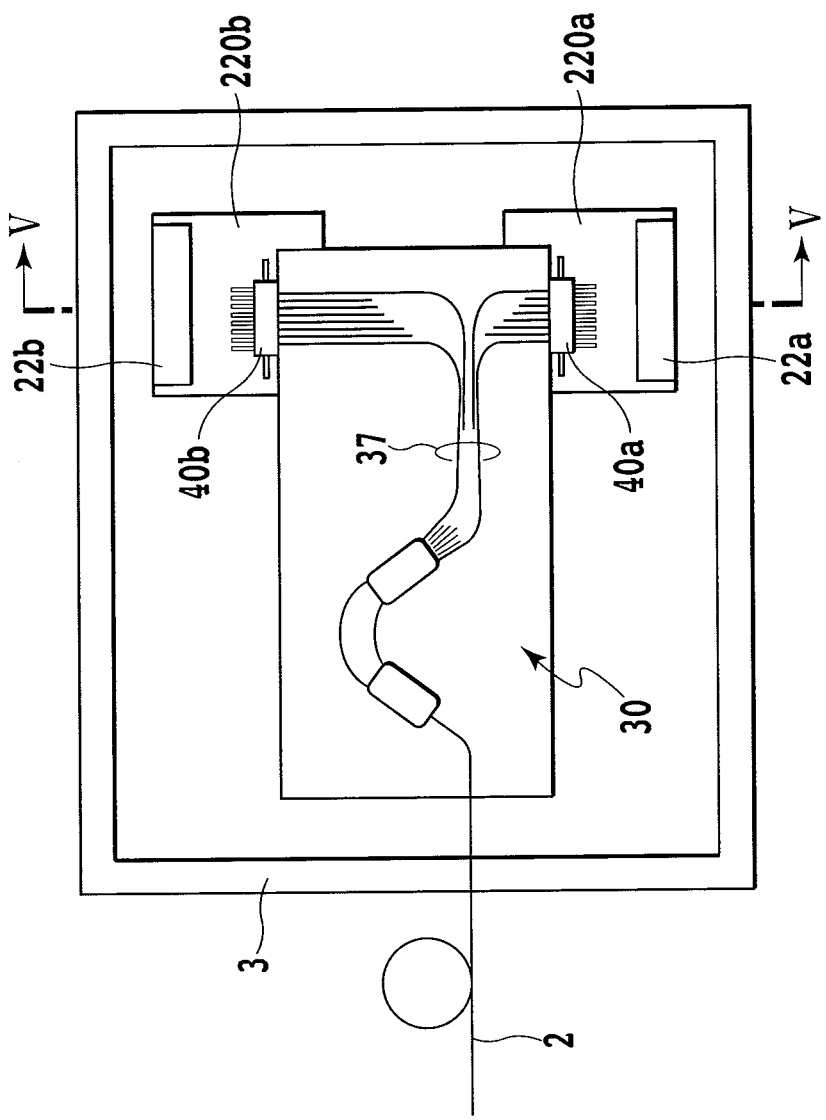
FIG. 8 is a top view illustrating the configuration of an optical module according to Embodiment 3 of the present invention.

FIG. 8 illustrates the configuration of an optical module according to Embodiment 3 of the present invention. The optical module 1 is a 16-channel optical power monitor that has the PLC 30 having an AWG having 16 output waveguides 37. An end face of the PLC 30 is joined to the two PD packages 40a and 40b storing therein the 8-channel PD array 43. The optical module 1 is structured so that the printed circuit boards 220a and 220b respectively including the PLC 30, the PD packages 40a and 40b, and the connectors 22a and 22b are provided in the housing 3. A wavelength division multiplexing signal of 16 waves input from the optical fiber 2 is branched by the AWG to optical signals having individual wavelengths and the signals are received by the light-receiving faces of the individual PDs stored in the PD packages 40a and 40b.

A cross-sectional view taken along V-V of FIG. 8 is identical as that of FIG. 5. Embodiment 3 is different from Embodiment 1 in the printed circuit board. In Embodiment 3, the print substrate is divided so that the two PD packages 40a and 40b are mounted on the respective two independent printed circuit boards 220a and 220b. As in Embodiment 1, a space having a fixed width in which the printed circuit board does not exist is provided along a line between the two the PD packages 40a and 40b (i.e., the straight line V-V between the mounting sections 202a and 202b). This can consequently reduce, even when a temperature fluctuation is caused, the stress applied between the two PD packages 40a and 40b to thereby avoid the positional displacement between the PD packages and the PLC, thus realizing an optical module having a small thermal fluctuation in characteristics.

Embodiment 4

Figure 9:
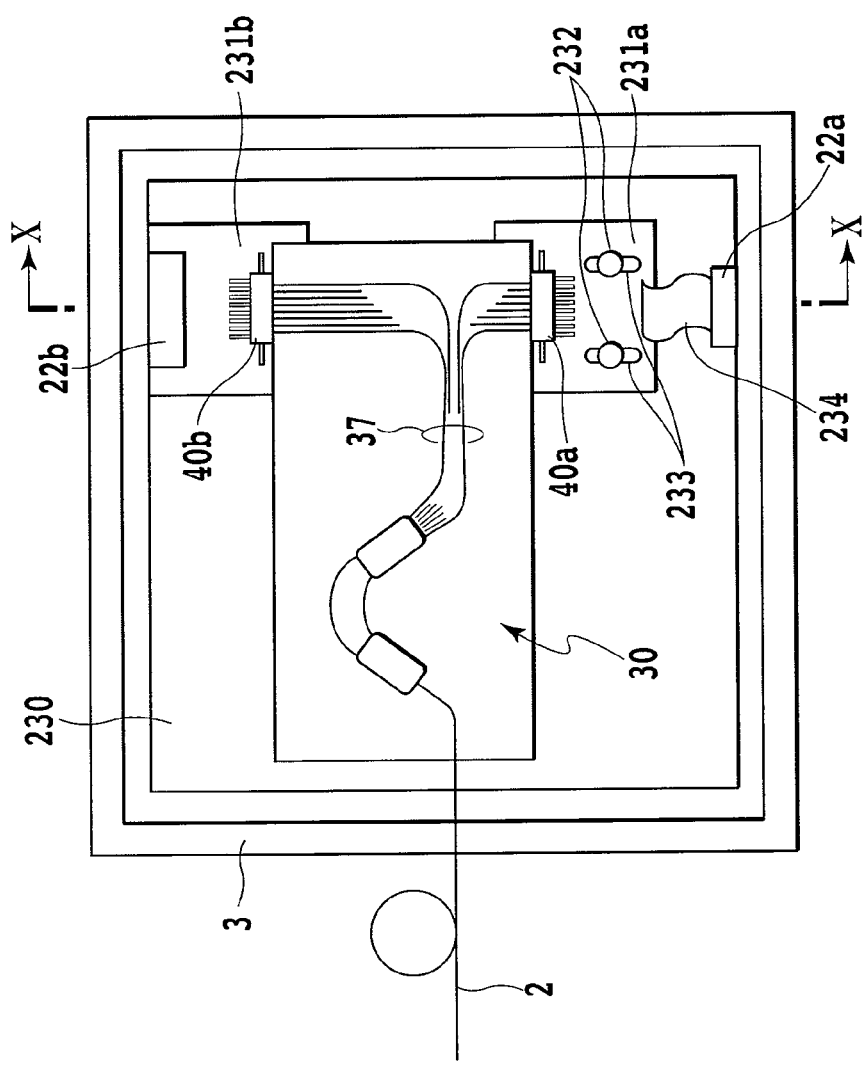
FIG. 9 is a top view illustrating the configuration of an optical module according to Embodiment 4 of the present invention.

FIG. 9 illustrates a configuration of an optical module according to Embodiment 4 of the present invention. the optical module 1 is a 16-channel optical power monitor that has the PLC 30 having an AWG having 16 output waveguides 37. An end face of the PLC 30 is joined to the two PD packages 40a and 40b storing therein the 8-channel PD array 43. The optical module 1 is structured so that the PLC 30, the PD packages 40a and 40b, the connectors 22a and 22b, sub-printed circuit boards 231a and 231b, and the printed circuit board 230 are provided in the housing 3. A wavelength division multiplexing signal of 16 waves input from the optical fiber 2 is branched by the AWG to optical signals having individual wavelengths and the signals are received by the light-receiving faces of the individual PDs stored in the PD packages 40a and 40b.

Figure 10:
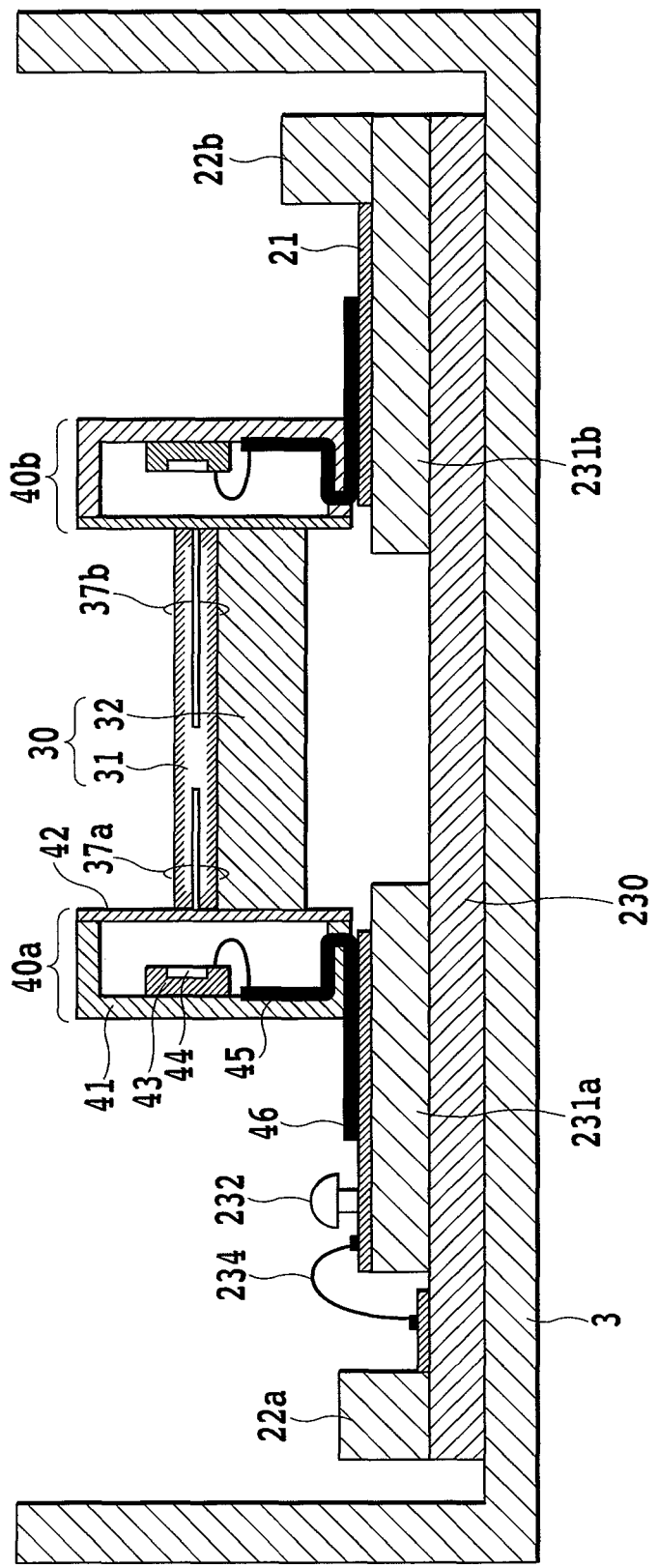
FIG. 10 is a cross-sectional view illustrating a method of fixing the PLC and the PD packages according to Embodiment 4.

FIG. 10 illustrates a method of fixing the PLC and the PD packages according to Embodiment 4. FIG. 10 is a cross-sectional view taken along X-X of FIG. 9. The output waveguide 37 of AWG has a vertically-polished end face that is joined to the glass covers 42 of the PD packages 40 by UV adhesive agent. The two PD packages 40a and 40b are mounted on the respective two independent sub-printed circuit boards 231a and 231b. The electric wiring 45 or the lead pin 46 of the PD packages 40 is soldered to the electric wiring 21 formed on the print sub-substrate 231.

The sub-printed circuit board 231b is fixed on the printed circuit board 230. The sub-printed circuit board 231b has thereon the connector 22b. The electric wiring 45 or the lead pin 46 of the PD package 40b is electrically connected to the connector 22b via an electric wiring formed on the sub-printed circuit board 231b.

The sub-printed circuit board 231a is not fixed on the printed circuit board 230 and can be slid by a fixed length along the straight line X-X connecting the mounting sections of the PD packages 40. The sub-printed circuit board 231a includes an oval hole 233. A screw 232 is fixed to the printed circuit board 230 via the hole 233. Even when a temperature fluctuation causes the substrate 32 to expand or contract to thereby have a size fluctuation, the sub-printed circuit board 231a moves on the printed circuit board 230 in accordance with the motion thereof. The electric wiring 45 or the lead pin 46 of the PD package 40a is electrically connected to the connector 22a via an electric wiring formed on the sub-printed circuit board 231a, a flexible printed circuit 234, and an electric wiring formed on the printed circuit board 230.

As in Embodiment 1, a space having a fixed width in which the printed circuit board does not exist is provided along a line between the two PD packages 40a and 40b (i.e., X-X). This can consequently reduce, even when a temperature fluctuation is caused, the stress applied to the two PD packages 40a and 40b. In addition, the above configuration prevents a stress from being applied to the two PD packages 40a and 40b to thereby avoid the positional displacement between the PD packages and the PLC, thus realizing an optical module having a small thermal fluctuation in characteristics.

Embodiment 5

Figure 11:
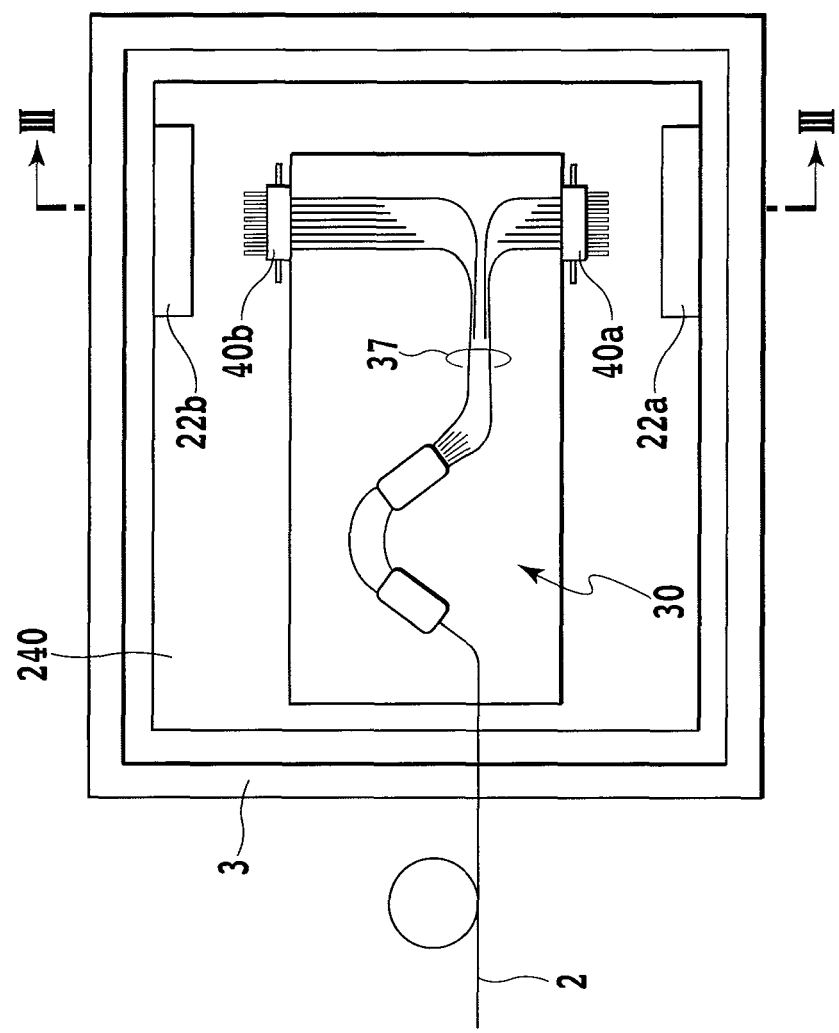
FIG. 11 is a top view illustrating an optical module according to Embodiment 5 of the present invention.

FIG. 11 illustrates a configuration of an optical module according to Embodiment 5 of the present invention. The optical module 1 is a 16-channel optical power monitor that has the PLC 30 having an AWG having 16 output waveguides 37. An end face of the PLC 30 is joined to the two PD packages 40a and 40b storing therein the 8-channel PD array 43. The optical module 1 is structured so that the printed circuit board 240 including the PLC 30, the PD packages 40a and 40b, and the connectors 22a and 22b is provided in the housing 3. A wavelength division multiplexing signal of 16 waves input from the optical fiber 2 is branched by the AWG to optical signals having individual wavelengths and the signals are received by the light-receiving faces of the individual PDs stored in the PD packages 40a and 40b.

A cross-sectional view taken along III-III of FIG. 11 is identical as that of FIG. 3. Embodiment 5 is different from the conventional optical module in the printed circuit board. Embodiment 5 uses the flexible printed circuit 240. The flexible printed circuit 240 can include, for example, a polyimide film as an insulator. The electric wiring 21 can be a copper foil. Since the flexible printed circuit 240 is flexible to stress, even when a temperature fluctuation causes the substrate 32 to expand or contract to thereby have a size fluctuation, the flexible printed circuit 240 expands or contracts in accordance with the motion thereof. This can consequently reduce, even when a temperature fluctuation is caused, the stress applied between the two PD packages 40a and 40b to thereby avoid the positional displacement between the PD packages and the PLC, thus realizing an optical module having a small thermal fluctuation in characteristics.

Embodiment 6

Figure 12:
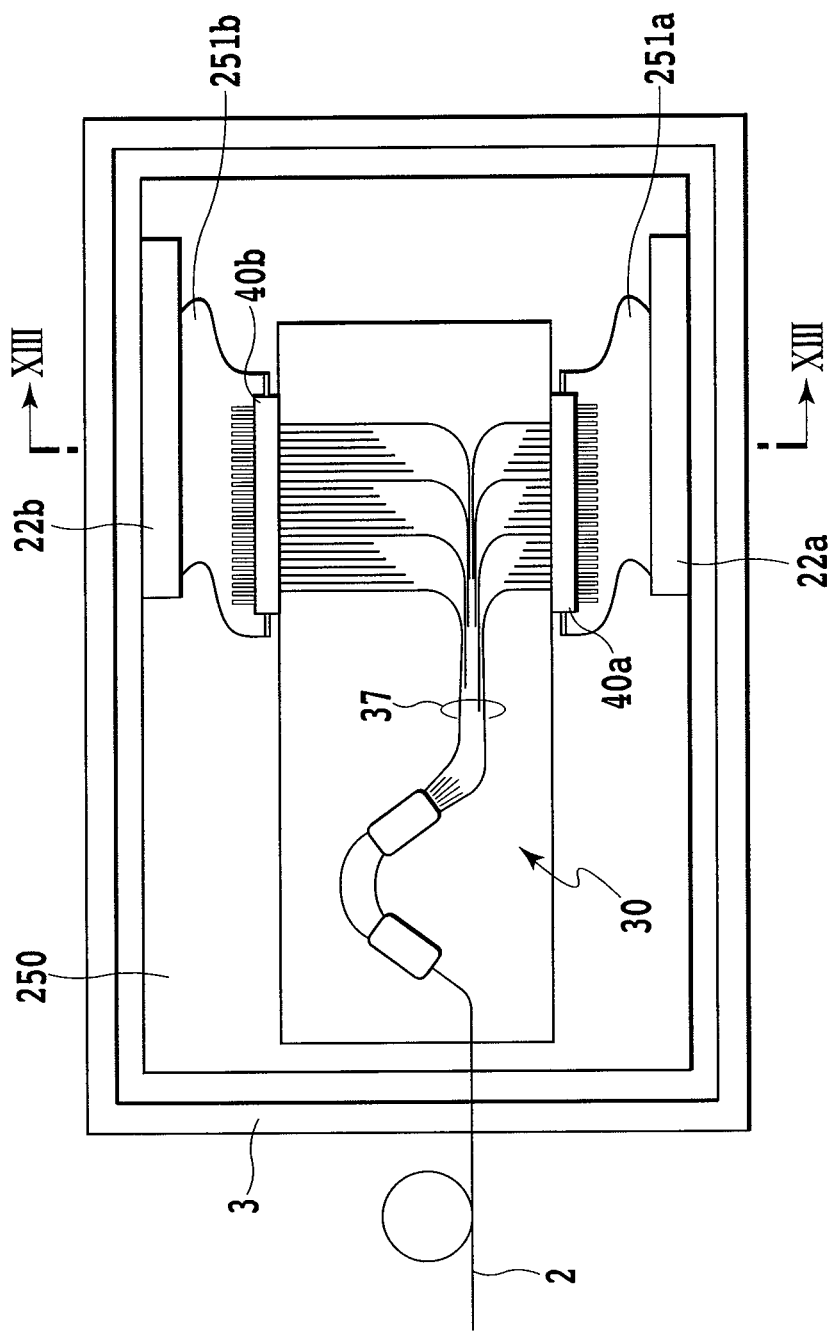
FIG. 12 is a top view illustrating an optical module according to Embodiment 6 of the present invention.

FIG. 12 illustrates a configuration of an optical module according to Embodiment 6 of the present invention. The optical module 1 is a 48-channel optical power monitor that has the PLC 30 having an AWG having 48 output waveguides 37. An end face of the PLC 30 is joined to the two PD packages 40a and 40b storing therein the 24-channel PD array 43. The optical module 1 is structured so that the printed circuit board 250 including the PLC 30, the PD packages 40a and 40b, and the connectors 22a and 22b is provided in the housing 3. A wavelength division multiplexing signal of 48 waves input from the optical fiber 2 is branched by the AWG to optical signals having individual wavelengths and the signals are received by the light-receiving faces of the individual PDs stored in the PD packages 40a and 40b.

Figure 13:
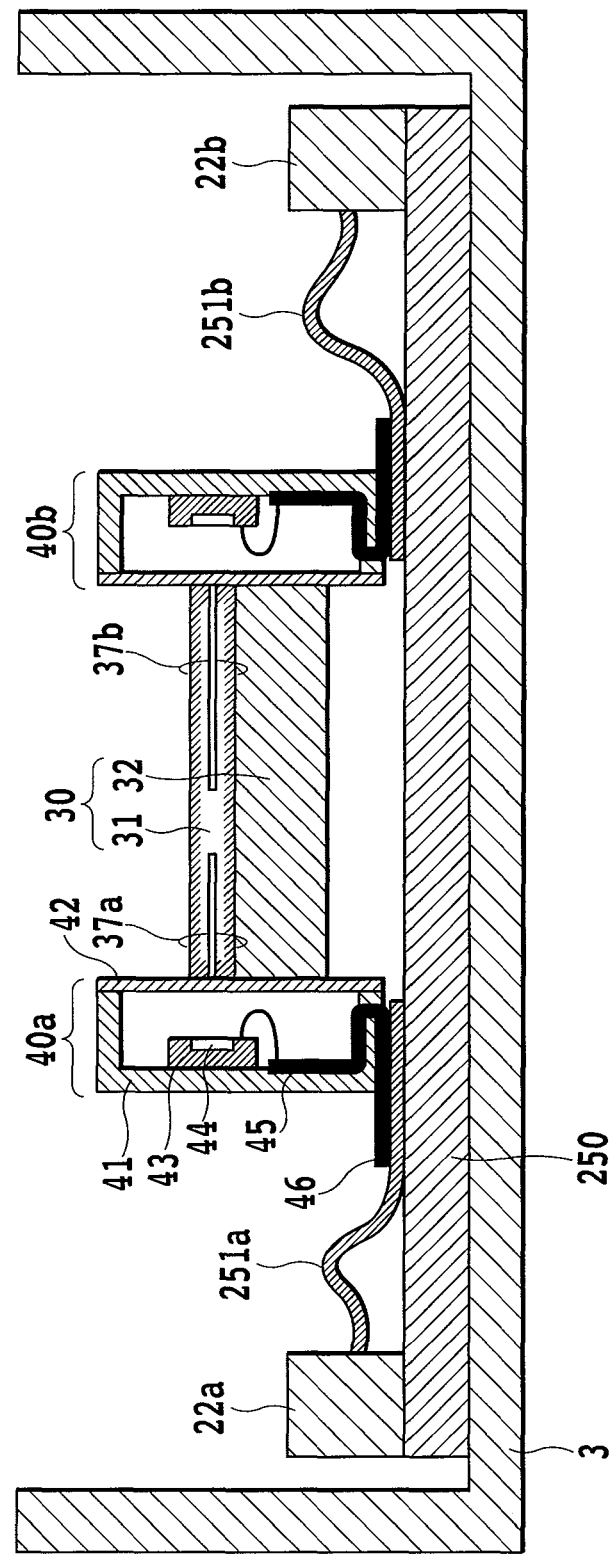
FIG. 13 is a cross-sectional view illustrating a method of fixing the PLC and the PD packages according to Embodiment 6.

FIG. 13 illustrates a method of fixing the PLC and the PD packages according to Embodiment 6. FIG. 13 is a cross-sectional view taken along XIII-XIII in FIG. 12. The output waveguide 37 of the AWG has a vertically-polished end face that is joined to the glass covers 42 of the PD packages 40 by UV adhesive agent. Although not shown, the PLC 30 is fixed at the four corners of the substrate 32 to the printed circuit board 250 by adhesive agent.

The two PD packages 40a and 40b are connected to the two respective independent flexible printed circuits 251a and 251b. The flexible printed circuits 251 are electrically connected to the connectors 22 provided on the printed circuit board 250. By using the individual flexible printed circuit 251 for each PD package 40, the PD packages 40 can be subjected to a wiring processing in advance and can be subsequently assembled. This can improve, when compared with Embodiment 4, the workability of the PD packages 40 during the assembly.

Furthermore, since the flexible printed circuits 251 are flexible to stress, such stress can be reduced that is caused when the substrate 32 expands or contracts due to the temperature fluctuation or that is caused during the assembly of the optical module. This can consequently reduce, even when the temperature fluctuation is caused, the stress applied between the two PD packages 40a and 40b to thereby avoid the positional displacement between the PD packages and the PLC, thus realizing an optical module having a small thermal fluctuation in characteristics.

Embodiment 7

FIG. 14n illustrates a configuration of an optical module according to Embodiment 7 of the present invention. The optical module 1 is a 48-channel optical power monitor that has the PLC 30 having an AWG having 48 output waveguides 37. An end face of the PLC 30 is joined to the two PD packages 40*a* and 40*b* storing therein the 24-channel PD array 43. The optical module 1 is structured so that the printed circuit board 260 including the PLC 30, the PD packages 40*a* and 40*b*, and the connectors 22*a* and 22*b* is provided in the housing 3. A wavelength division multiplexing signal of 48 waves input from the optical fiber 2 is branched by the AWG to optical signals having individual wavelengths and the signals are received by the light-receiving faces of the individual PDs stored in the PD packages 40*a* and 40*b*.

Figure 14:
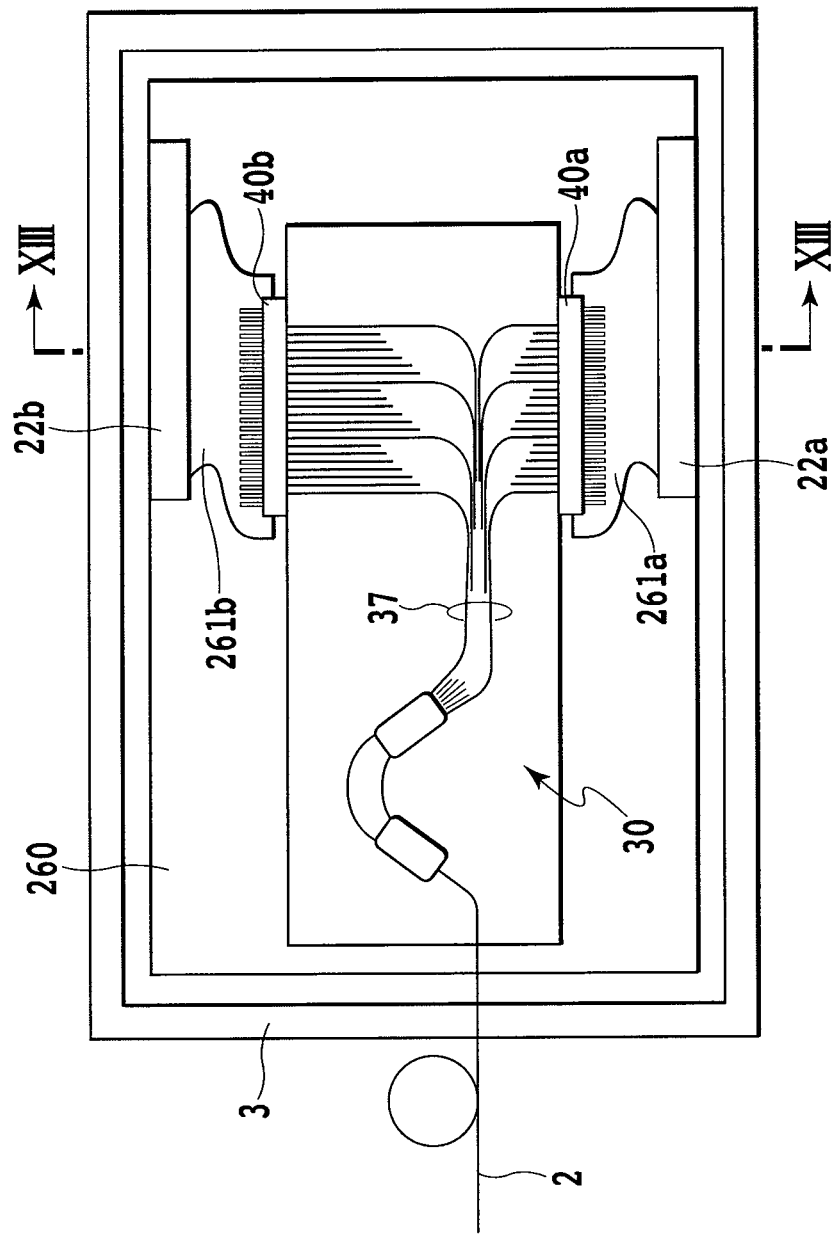
FIG. 14 is a top view illustrating an optical module according to Embodiment 7 of the present invention.

A cross-sectional view taken along XIII-XIII of FIG. 14 is identical as that of FIG. 13. Embodiment 7 is different from the optical module of Embodiment 6 in the packaging of the flexible printed circuit. In Embodiment 7, the PD packages 40 are wire-connected to the flexible printed circuits 261 by an anisotropically-conductive film (ACF). When this is compared with a case where the PD packages and the flexible printed circuits are fixed by soldering as in Embodiment 6, the wire connection can be performed at a lower temperature, thus improving the workability. Thus, an optical module superior in mass productivity can be realized.

Embodiment 8

In Embodiments 1 to 7, an optical power monitor has been exemplarily described in which a wavelength division multiplexing signal is branched by the AWG to optical signals having individual wavelengths and the signals are received by the light-receiving faces of the individual PDs in the PD packages. In Embodiment 8, a multiwavelength light source will be described. The PD packages of Embodiments 1 to 7 are substituted with an LD package storing therein an LD array in which a plurality of semiconductor lasers are integrated. Laser beams emitted from the individual LDs are multiplexed by the AWG and the resultant wavelength division multiplexing signal is outputted from the optical fiber. Even when Embodiments 1 to 7 are applied to a light source, the positional displacement between the LD package and the PLC due to thermal stress can be avoided, thus realizing an optical module having a small thermal fluctuation in characteristics.

Embodiment 9

Figure 15:
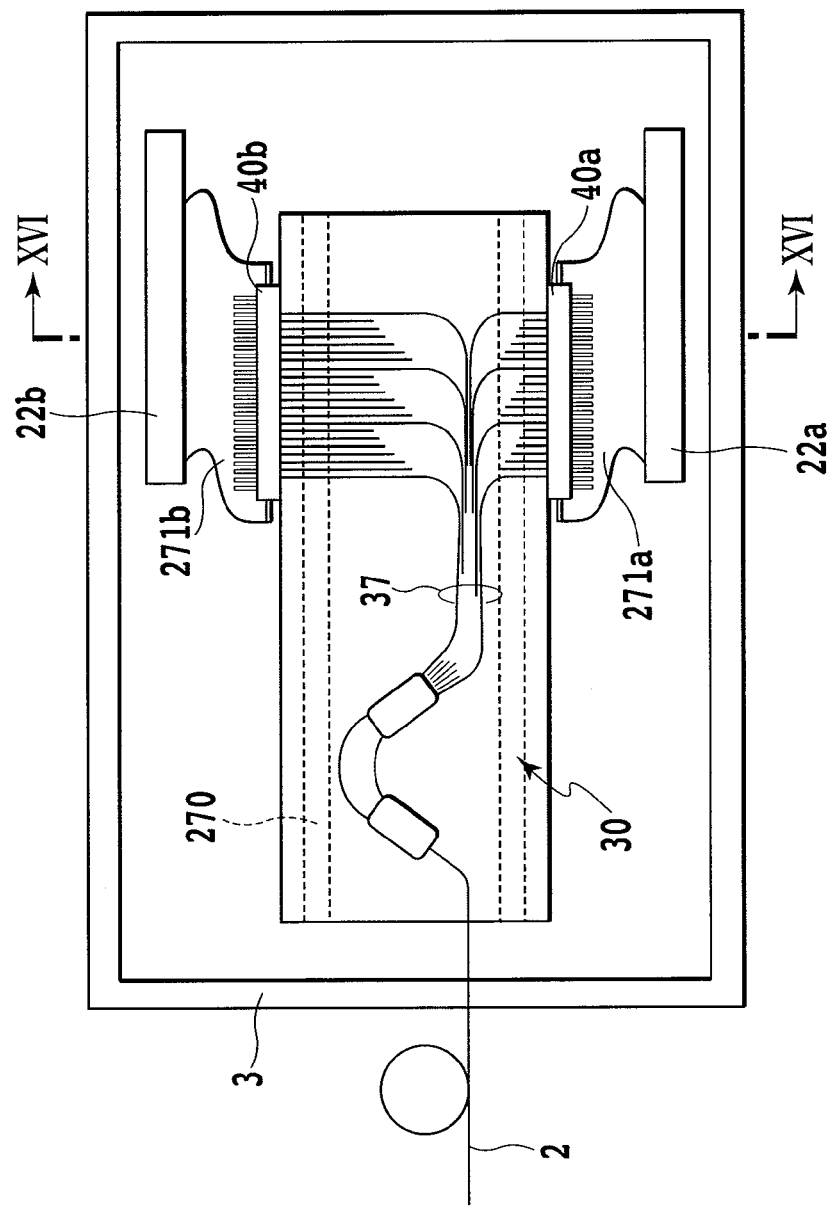
FIG. 15 is a top view illustrating an optical module according to Embodiment 9 of the present invention.

FIG. 15 illustrates a configuration of an optical module according to Embodiment 9 of the present invention. The optical module 1 is a 48-channel optical power monitor that has the PLC 30 having an AWG having 48 output waveguides 37. An end face of the PLC 30 is joined to the two PD packages 40*a* and 40*b* storing therein the 24-channel PD array 43. The optical module 1 is structured so that the PLC 30, the PD packages 40*a* and 40*b*, and the connectors 22*a* and 22*b* are provided in the housing 3. A wavelength division multiplexing signal of 48 waves input from the optical fiber 2 is branched by the AWG to optical signals having individual wavelengths and the signals are received by the light-receiving faces of the individual PDs stored in the PD packages 40*a* and 40*b*.

Figure 16:
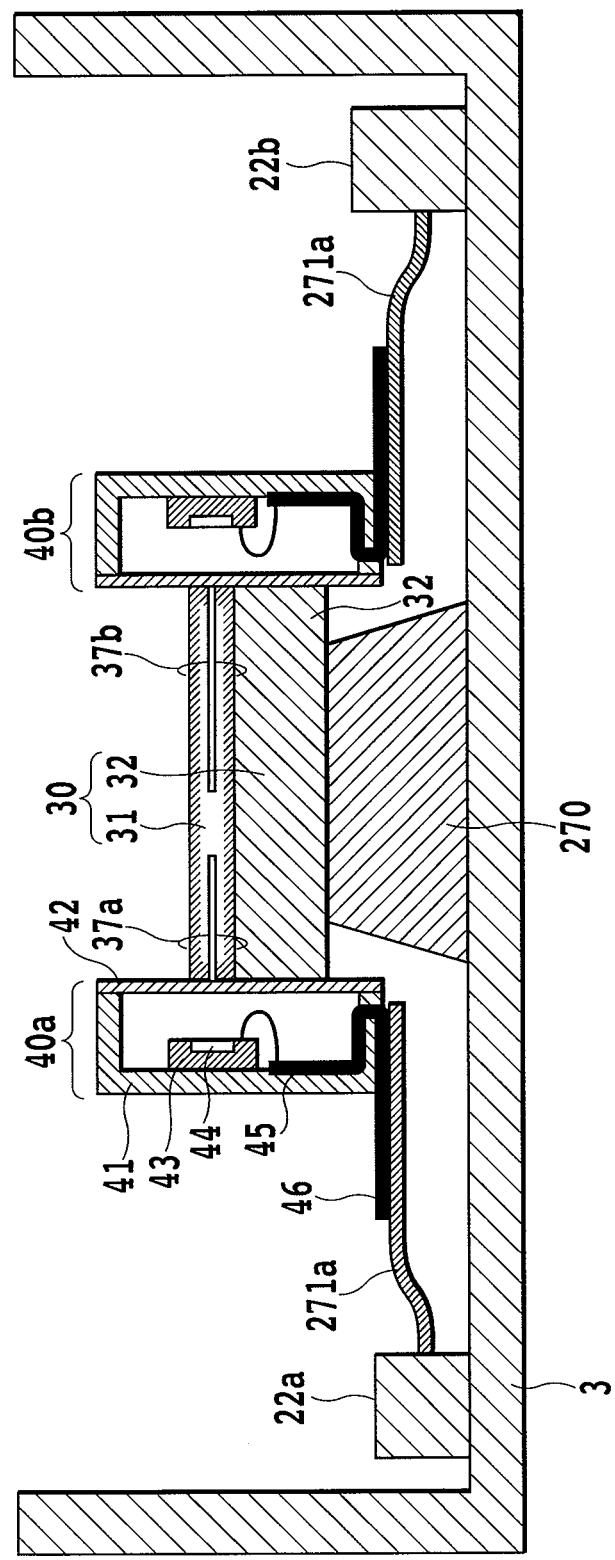
FIG. 16 is a top view illustrating an optical module according to Embodiment 10 of the present invention.

FIG. 16 illustrates a method of fixing the PLC and the PD packages according to Embodiment 9. FIG. 16 is a cross-sectional view taken along XVI-XVI in FIG. 15. The output waveguide 37 of the AWG has a vertically-polished end face that is joined to the glass covers 42 of the PD packages 40 by UV adhesive agent. The PLC 30 is fixed to an upper face of a protrusion 270 formed on the bottom section of the housing 3. The PD packages 40 and the flexible printed circuits 271 are fixed so as no to have a contact with the housing 3. The protrusion 270 may have the trapezoidal shape as shown or also may have a convex shape.

The two PD packages 40*a* and 40*b* are connected to the two respective independent flexible printed circuits 271*a* and 271*b*. The flexible printed circuits 271 are electrically connected to an electric part such as the connectors 22 provided in the housing 3. By using the individual flexible printed circuit 271 for each PD package 40, the PD packages 40 can be subjected to a wiring processing in advance and can be subsequently assembled. This can improve, when compared with Embodiment 4, the workability of the PD packages 40 during the assembly.

Furthermore, since the flexible printed circuits 271 are flexible to stress, such stress can be reduced that is caused when the substrate 32 expands or contracts due to the temperature fluctuation or that is caused during the assembly of the optical module. Furthermore, since the PD package does not have a direct contact with the housing, even when the temperature fluctuation is caused, no positional displacement is caused between the PD packages and the PLC, thus realizing an optical module having a small thermal fluctuation in characteristics.

Embodiment 10

Figure 17:
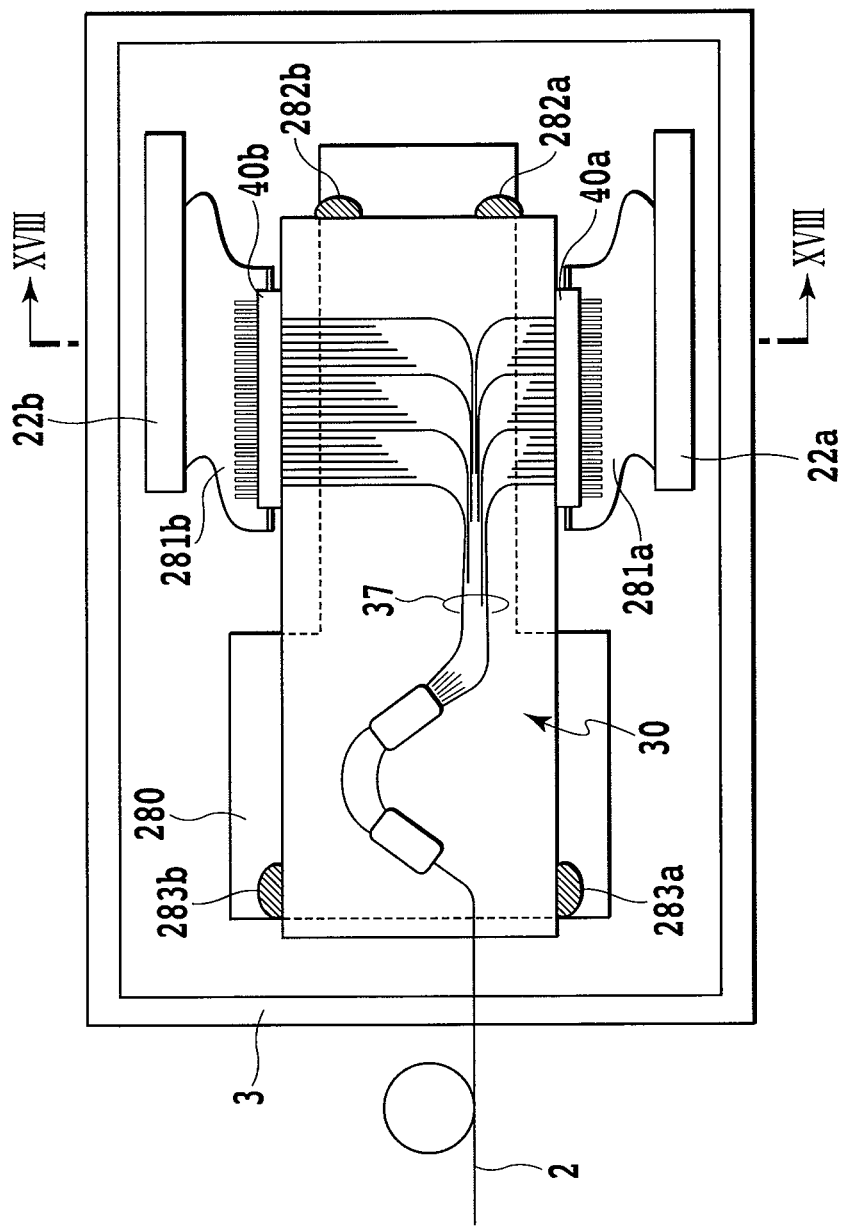
FIG. 17 is a cross-sectional view illustrating a method of fixing the PLC and the PD packages according to Embodiment 9.

FIG. 17 illustrates a configuration of an optical module according to Embodiment 10 of the present invention. The optical module 1 is a 48-channel optical power monitor that has the PLC 30 having an AWG having 48 output waveguides 37. An end face of the PLC 30 is joined to the two PD packages 40*a* and 40*b* storing therein the 24-channel PD array 43. The optical module 1 is structured so that the PLC 30, the PD packages 40*a* and 40*b*, and the connectors 22*a* and 22*b* are provided in the housing 3. A wavelength division multiplexing signal of 48 waves input from the optical fiber 2 is branched by the AWG to optical signals having individual wavelengths and the signals are received by the light-receiving faces of the individual PDs stored in the PD packages 40*a* and 40*b*.

Figure 18:
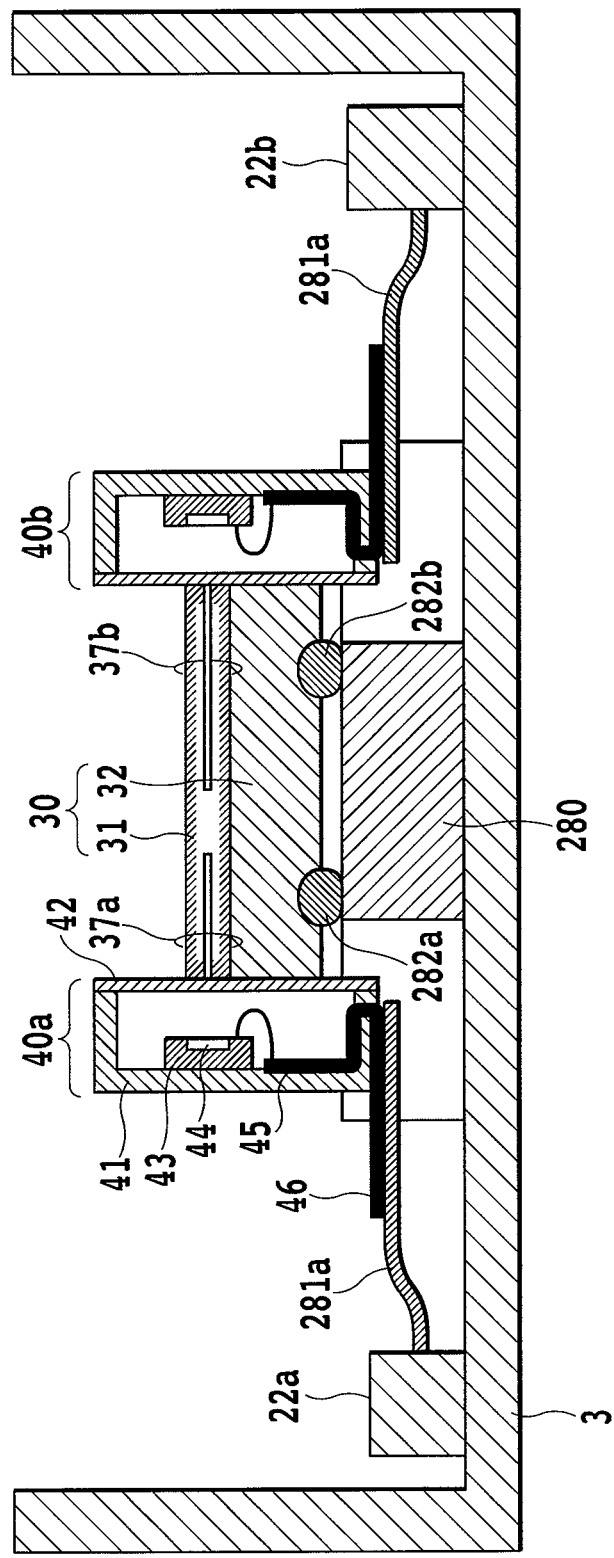
FIG. 18 is a cross-sectional view illustrating a method of fixing the PLC and the PD packages according to Embodiment 10.

FIG. 18 illustrates a method of fixing the PLC and the PD packages according to Embodiment 10. FIG. 18 is a cross-sectional view taken along XVIII-XVIII in FIG. 17. The output waveguide 37 of the AWG has a vertically-polished end face that is joined to the glass covers 42 of the PD packages 40 by UV adhesive agent. The PLC 30 is fixed to the convex section 280 formed in the bottom section of the housing 3 by elastic adhesive agents 282 and 283. The elastic adhesive agents can provide an effect of reducing an impact force by which the resistance against impact vibration can be improved. Furthermore, flowable filler is filled in the interface between the PLC 30 and the convex section 280.

The two PD packages 40*a* and 40*b* are connected to the two respective independent flexible printed circuits 281*a* and 281*b*. The flexible printed circuits 281 are electrically connected to the connectors 22 provided in the housing 3. By using the individual flexible printed circuit 281 for each PD package 40, the PD packages 40 can be subjected to a wiring processing in advance and can be subsequently assembled. This can improve, when compared with Embodiment 4, the workability of the PD packages 40 during the assembly.

The elastic adhesive agent 282 fixes the PLC 30 and the convex section 280 at the neighborhood of the PD packages 40. This allows, when the optical module receives a vibrational impact, the neighborhood of the PD packages 40 to absorb the displacement of the part at which the PLC 30 is connected to the PD packages 40, thus suppressing a failure due to a vibrational impact.

Furthermore, the filler filed between the PLC 30 and the convex section 280 provides an adsorptive power between the PLC 30 and the housing 3. This adsorptive power can improve the impact resistance even when am impact is applied in the orthogonal direction of the optical module. When the filler has flowability, a mild fluctuation due to a temperature fluctuation and reduced stress is absorbed by the deformation of the filler to thereby reduce the stress from the housing 3. A rapid displacement such as a vibrational impact on the other hand is not followed by the deformation of the filler and thus the PLC 30 is displaced together with the housing 3. This can consequently improve the impact resistance.

The elastic adhesive agent 282 fixes the PLC 30 and the convex section 280 at one of opposing short sides of the PLC 30. The elastic adhesive agent 283 fixes the PLC 30 and the convex section 280 at the orthogonal long side, not at the other short side. When a temperature fluctuation is caused, a difference in thermal expansion coefficient between the housing 3 and the substrate 32 causes a displacement of a fixed section at which the PLC 30 is fixed by adhesive agent. This displacement is high in the longitudinal direction of the PLC 30. Thus, if the fixation is carried out at opposing short sides of the PLC 30, the displacement in the longitudinal direction is hindered and thus a high stress is applied to the PLC 30. This stress causes a distortion of the optical circuit formed in the PLC 30. This distortion deteriorates the optical characteristic of the optical module. According to Embodiment 10, since the fixation is carried out only at one of the opposing short sides of the PLC 30, the stress in the longitudinal direction can be reduced.

In the embodiment, the PLC substrate is not limited to a silicon substrate and also may be a quartz substrate for example. The PLC also may be a planar lightwave circuit including polymer as a main component. The optical circuit formed in the PLC is not limited to the AWG and also may be, for example, an optical switch and a branch coupler circuit. Thus, the invention is not limited to any PLC circuit configuration.

The invention claimed is:

1. An optical module in which a plurality of packages storing therein optical elements is directly joined to an end face of a waveguide of a planar lightwave circuit, the planar lightwave circuit being positioned on a top surface of a substrate and the end face being positioned at a perimeter sidewall of the substrate so that the waveguide is optically coupled to the optical elements, comprising:
    a housing storing therein the planar lightwave circuit and the plurality of packages, wherein a bottom surface of the substrate is fixed to an upper face of a protrusion formed in a bottom section of the housing,
    wherein each of the plurality of packages does not contact the housing, and
    wherein a plurality of lead pins are attached to each package, each lead pin being electrically coupled to a separate one of the optical elements, the lead pins being fixedly attached to a flexible printed circuit that is fixedly attached to an electric part fixed in the housing such that the optical elements are electrically coupled to the electric part via the flexible printed circuit.

2. The optical module according to claim 1, wherein the protrusion of the housing and the planar lightwave circuit are fixed by an elastic adhesive agent.

3. The optical module according to claim 2, wherein the protrusion of the housing and the planar lightwave circuit are fixed so that only one of opposing short sides of the planar lightwave circuit is fixed by the elastic adhesive agent.

4. The optical module according to claim 3, wherein the protrusion of the housing and the planar lightwave circuit are fixed so that one of the opposing short sides of the planar lightwave circuit is fixed in the vicinity of the package.

5. The optical module according to claim 1, wherein flowable filler is filled in an interface between the protrusion of the housing and the planar lightwave circuit.

6. The optical module recited in claim 1, wherein each package extends downward beyond the bottom surface of the substrate.

7. The optical module recited in claim 1, wherein each package is positioned so as to not directly join with the top surface of the substrate.

8. The optical module recited in claim 1, wherein each package is positioned so as not to be positioned directly above the protrusion.

9. The optical module recited in claim 1, wherein the only direct contact between the substrate and the housing is the contact between the bottom surface of the substrate and the upper face of the protrusion.

10. An optical module comprising:
    a housing having a protrusion extending upward from a bottom portion thereof;
    a planar lightwave circuit disposed within the housing, the planar lightwave circuit comprising:
        a substrate having a top surface and an opposing bottom surface with a perimeter sidewall extending therebetween, the bottom surface being fixed to the protrusion so as to be positioned directly above the protrusion; and
        an optical waveguide formed on the top surface of the substrate, the optical waveguide having an end face at the perimeter sidewall;
    a package fixed to the perimeter sidewall of the substrate so as to not contact the housing, the package having positioned thereon a plurality of optical elements, the optical elements being positioned so as optically couple with the optical waveguide at the end face of the optical waveguide;
    a plurality of lead pins attached to the package, each lead pin being electrically coupled to a separate one of the optical elements;
    an electric part fixed within the housing; and
    a flexible connector extending between and being fixedly attached to the plurality of lead pins and the electric part such that the electric part is electrically coupled to the optical elements via the flexible connector.

11. The optical module recited in claim 10, wherein the package extends downward beyond the bottom surface of the substrate.

12. The optical module recited in claim 10, wherein the package is positioned so as to not directly join with the top surface of the substrate.

13. The optical module recited in claim 10, wherein the package is positioned so as not to be positioned directly above the protrusion.

14. The optical module recited in claim 10, wherein the only direct contact between the substrate and the housing is the contact between the bottom surface of the substrate and the protrusion.

15. The optical module recited in claim 10, wherein the package comprises a glass cover and wherein the end face of the optical waveguide is joined to the glass cover of each package.

16. The optical module recited in claim 15, wherein the end face of the optical waveguide is joined to the glass cover of the package by an ultraviolet (UV) adhesive agent.

17. The optical module recited in claim 10, wherein the flexible connector comprises a flexible printed circuit.

18. The optical module recited in claim 17, wherein the flexible printed circuit does not contact the housing.

19. The optical module recited in claim 10, wherein the electric part comprises a connector.

20. The optical module recited in claim 10, wherein the bottom surface of the substrate is fixed to the protrusion using an elastic adhesive agent.

21. An optical module comprising:
a housing having a protrusion extending upward from a bottom portion thereof;
a planar lightwave circuit disposed within the housing, the planar lightwave circuit comprising:
  a substrate having a top surface and an opposing bottom surface with a perimeter sidewall extending therebetween, the bottom surface being fixed to the protrusion so as to be positioned directly above the protrusion; and
  an optical waveguide formed on the top surface of the substrate, the optical waveguide having an end face at first and second edges on opposing sides of the perimeter sidewall;

first and second packages respectively fixed to the first and second edges of the perimeter sidewall of the substrate so as to not contact the housing, each package having positioned thereon a plurality of optical elements, the optical elements being positioned so as optically couple with the optical waveguide at the end face of the optical waveguide;

a plurality of lead pins attached to each package, each lead pin being electrically coupled to a separate one of the optical elements;

first and second electric parts fixed within the housing on opposite sides of the protrusion; and first and second flexible connectors respectively fixedly attached to the lead pins corresponding to the first and second packages, the first and second flexible connectors also respectively fixedly attaching to the first and second electric parts such that the optical elements of the first and second packages are respectively electrically coupled to the first and second electric parts via the first and second flexible printed circuits.

22. The optical module recited in claim 21, wherein each electric part comprises an electrical connector.

* * * * *

UNITED STATES PATENT AND TRADEMARK OFFICE
CERTIFICATE OF CORRECTION

PATENT NO.        : 8,545,111 B2                                                Page 1 of 1
APPLICATION NO. : 12/666583
DATED             : October 1, 2013
INVENTOR(S)       : Ohyama et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 708 days.

Signed and Sealed this
Fifteenth Day of September, 2015

Michelle K. Lee
*Director of the United States Patent and Trademark Office*